United States Patent [19]
Mitchell

[11] Patent Number: 5,673,985
[45] Date of Patent: Oct. 7, 1997

[54] MODULAR ELECTRONIC COMPONENTS CABINET STRUCTURE

[76] Inventor: Jerry B. Mitchell, 3902 Dixie Dr., Garland, Tex. 75041

[21] Appl. No.: 670,370

[22] Filed: Jun. 25, 1996

[51] Int. Cl.[6] ............................................. A47B 47/00
[52] U.S. Cl. ................... 312/265.3; 312/265.1; 312/263; 312/223.1
[58] Field of Search .................... 312/223.1, 265.1, 312/265.4, 265.2, 265.3, 265.6, 263, 257.1; 52/271; 211/26, 189, 194; 403/336, 337

[56] References Cited

U.S. PATENT DOCUMENTS

| | | |
|---|---|---|
| 3,149,437 | 9/1964 | Wheeler-Nicholson ............. 52/271 |
| 3,563,627 | 2/1971 | Whipps ................................ 312/265.2 |
| 4,433,881 | 2/1984 | Witten et al. . |
| 4,544,069 | 10/1985 | Cavaluni . |
| 4,988,008 | 1/1991 | Blum et al. ......................... 211/189 |
| 4,997,240 | 3/1991 | Schmalzi et al. . |
| 5,020,866 | 6/1991 | McIlwraith . |
| 5,142,445 | 8/1992 | Sorensen et al. . |
| 5,165,770 | 11/1992 | Hahn . |
| 5,202,818 | 4/1993 | Betsch et al. . |
| 5,304,434 | 4/1994 | Stone . |
| 5,326,162 | 7/1994 | Bovermann ........................ 312/265.3 |
| 5,380,083 | 1/1995 | Jones et al. . |

FOREIGN PATENT DOCUMENTS

| | | | |
|---|---|---|---|
| 512930 | 11/1992 | European Pat. Off. ............ 211/194 |
| 607831 | 7/1994 | European Pat. Off. ............ 312/257.1 |
| 583986 | 9/1933 | Germany ........................... 312/265.3 |
| 1554473 | 1/1970 | Germany ........................... 312/265.1 |
| 3025962 | 2/1982 | Germany ........................... 312/263 |
| 406090089 | 3/1994 | Japan ................................. 312/257.1 |
| 902819 | 8/1962 | United Kingdom ................ 312/264 |

Primary Examiner—Peter M. Cuomo
Assistant Examiner—Hanh V. Tran
Attorney, Agent, or Firm—John F. Bryan

[57] ABSTRACT

An electronic equipment cabinet having an unobstructed interior is made as an assembly of joined-together side wall modules, with the vertical edge sections thereof being aligned, and the joints therebetween being stiffened, by internally fitting and overlapping reinforcing members. Cooling air circulation is allowed by peripherally ventilated external panels, which, although included in the modules, do not contribute to joint stiffness are and may thus, be omitted if so desired.

10 Claims, 3 Drawing Sheets

MODULAR ELECTRONIC COMPONENTS CABINET STRUCTURE

FIELD OF THE INVENTION

The present invention relates to modular sheet-metal cabinets for electronic components and more particularly, to construction of such cabinets as m plurality of standardized modules, with mutually interlocking members for rigid assembly.

BACKGROUND AND SUMMARY OF THE INVENTION

As a common practice in the industry, electronic equipment cabinet structures have comprised formed sheet metal members, which are either welded together or otherwise joined at the cabinet corners. The nature of the application dictates that the resulting assembly should be substantial, suitable for installation and protection of valuable electronic components, and must provide for air flow, to take away heat generated by operation of these components. Typically, in a full height cabinet, a series of vertically spaced mounting holes are provided along each side, both front and rear, and the cabinet interior is not obstructed by any transverse members, These mounting holes provide predetermined, standard attachment points for the installation of electronic circuit boards or assembled components. Fans may be used to draw in and circulate cooling air if necessary but, more often than not, neither the front nor rear of the cabinet is enclosed. Inasmuch as installation volume requirements vary greatly from one system to the next, cabinets are available in height increments, ranging from approximately 18" to 72" or more. Units of similar size will frequently be joined together in a side-by-side array for the installation of a larger system.

Stacking a plurality of short cabinet assemblies to make a taller unit for increased installation volume is generally not acceptable because, while the segmented vertical structure needs bracing to provide an essential degree of rigidity, added interior structure would significantly diminish usable volume. Modular cabinet systems of the prior art are generally modular only in the sense of being an assembly of parts selected to provide a cabinet of the desired height. Such cabinets need load bearing transverse members to provide assembled stiffness, particularly in the absence of front and rear panel enclosures, but become less space-efficient as a result.

System growth must either be anticipated by initial provision of an excess of installation volume, or be accommodated later by an add-on unit or a larger replacement cabinet. Since an add-on unit often requires unavailable floor or bench space, replacement of an otherwise usable cabinet with one of greater height may well become the only viable alternative. Full height cabinets tend to be considerably heavier than 70 lbs. and, even though knocked-down and packaged, are not only burdensome to the user, but exceed the weight and/or size limitations for normal handling by express carriers. Shipment of such packages entails either premium rate surcharges or relatively inconvenient motor freight.

An object of the present invention is therefore, to provide a cabinet system configured as an array of identical modules, which can be assembled in vertical or side-by-side groupings for flexible installation volume. A second object is that this cabinet assembly provide an essential degree of rigidity, with or without front and rear panel enclosures. A third object is that the assembled cabinet not have any intrusion of internal bracing into the installation volume provided and, yet another object is, that this cabinet system provide a module package of an appropriate weight and size for express carrier shipment.

The present invention achieves these objects by providing individual cabinet modules of reduced height, configured so that several can be stacked in an assembly to make a full height unit. The stacking of modules results in jointed vertical members and the inclusion of a bending load bearing splint element provides the required stiffness. Reinforcing members, fitted at the standing corners of the assembly and overlapping the module joints do not intrude into the cabinet interior. A preferred design maintains seamless component mounting hole bolt pattern spacing across the module joints to promote flexibility in the utilization of installation volume. By virtue of the module's reduced height, the size and weight of a disassembled and packaged unit is easily held within the usual express carrier limitations of 130 inches in girth and 70 pounds in weight.

DESCRIPTION OF THE DRAWINGS

The aforementioned and other objects and features of the invention will be apparent from the following detailed description of specific embodiments thereof, when read in conjunction with the accompanying drawings, in which.

DETAILED DESCRIPTION OF THE DRAWINGS

Figure 1:
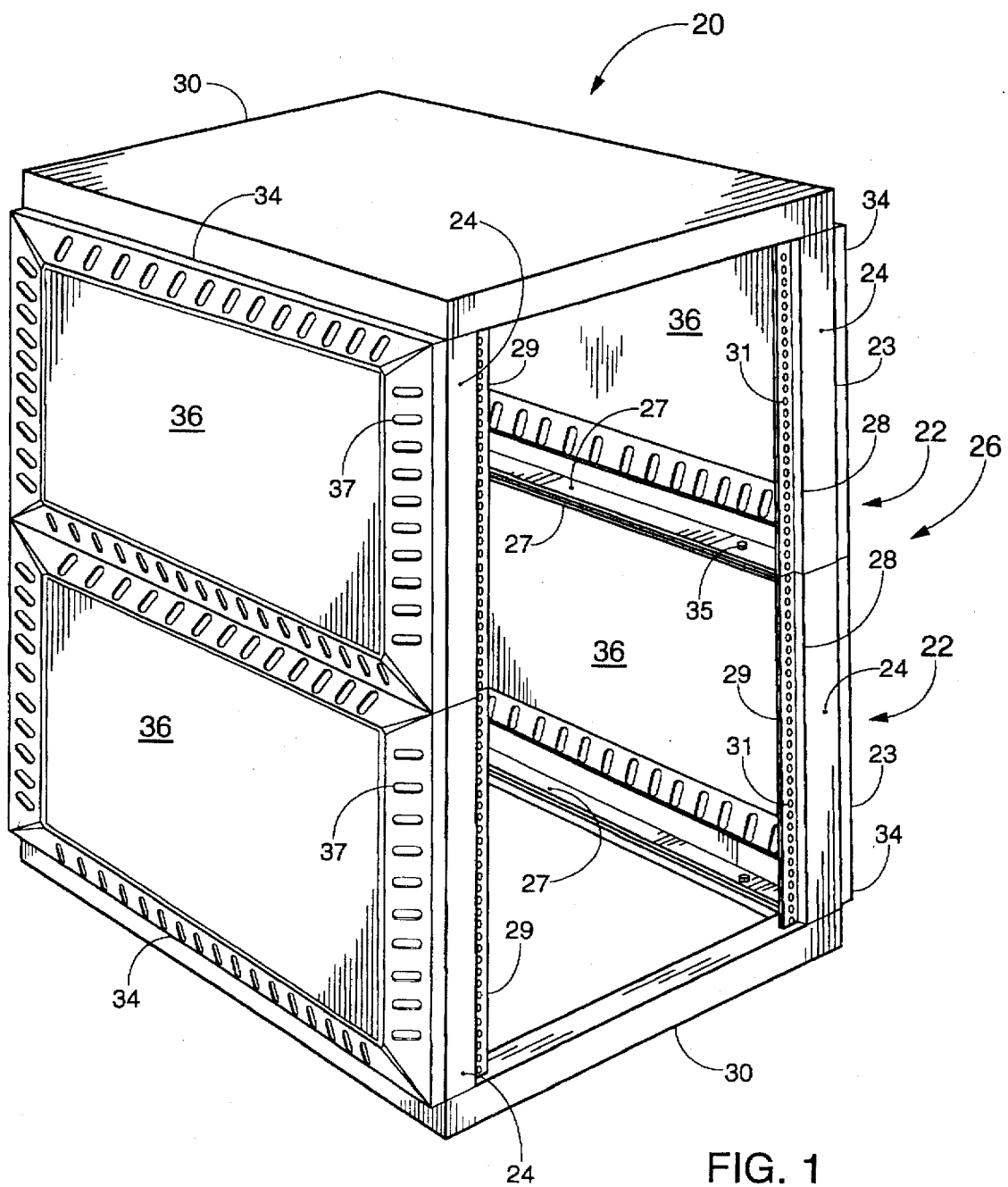
FIG. 1. shows a preferred embodiment of the present invention wherein two modules are joined as an assembly.

FIGS. 1–4 show various views of a preferred embodiment of the present invention and use the same identifying numbers for the same components. In FIG. 1 is shown cabinet 20, an assembly of stacked modular sub-assemblies 22. Each modular sub-assembly 22 comprises a rectangular side frame 23, which is symmetrical, both left-to-right and top-to-bottom, and is covered by matching side panel 34. In this preferred embodiment, side panels 34 are given a raised center portion 36 and peripheral venting slots 37 for cooling air circulation. Cabinet assembly 20 is made up from four modular sub-assemblies 22, joined together by nut and bolt fasteners 35 to provide opposed cabinet side structures 26, and completed by attachment of interchangeable top and bottom members 30 with additional nut and bolt assemblies 35. All of the above mentioned members are precisely blanked and formed sheet metal parts, made within production tolerances of 0.010" or less. Each rectangular side frame 23 is preferably formed from a single piece of sheet metal, bordered by flanges 27 perpendicular to planar side 21 (see FIG. 4) at both longitudinal edges and outer face flanges 24, with return flanges 28 forming "C" sections 38, at the vertical edges. Each return flange 28 is further extended and formed, perpendicular to planar side 21 and side panels 34, so as to provide flanges 29. Each flange 29 has continuous bolt pattern 31 along its length. Bolt patterns 31 are spaced on ⅝"-⅝"-½" centers for standardized component mounting holes and are arranged so that, at each end, there is a center-to-edge distance of 5/16". This makes a spacing of ⅝" across the joint of sub-assenblies 22 to provide for pattern continuity along the length of aligned flanges 29. The cabinet is typically furnished with open front and rear access, as is shown here, but in other cases, where fully open cabinets are desired, the user may choose to omit side panels 34 without sacrificing structural stiffness. Should full enclosure be desired for security, additional front and rear panels, similar to side panels 34, can be provided. In such installations, peripheral venting slots 37 allow sufficient convection cooling air circulation so that internal fans are usually not required.

Figure 2:
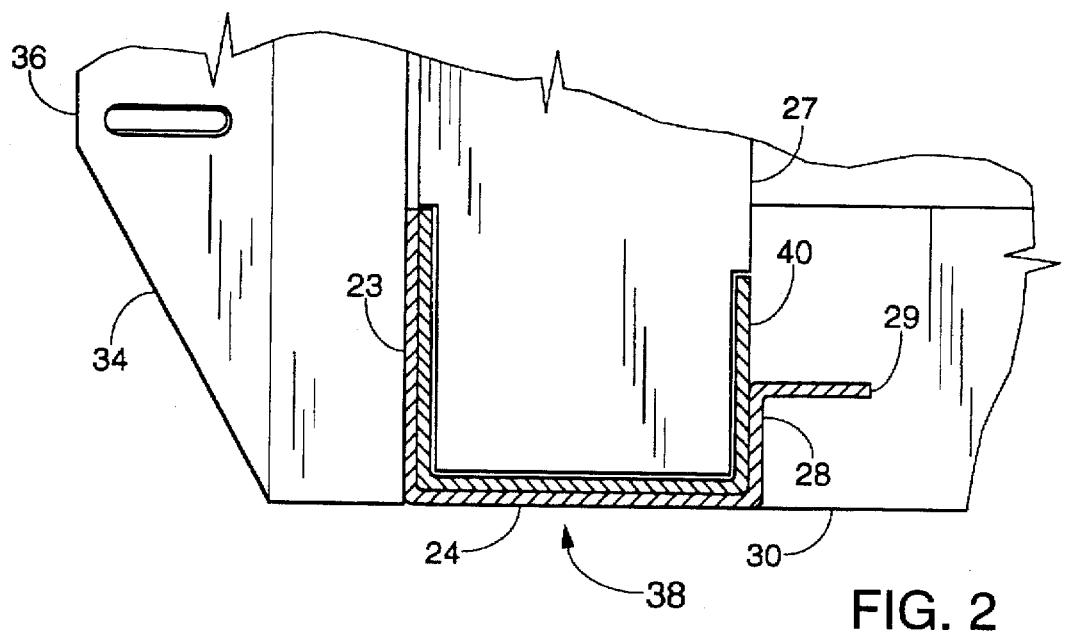
FIG. 2 shows a section view of the corner of the preferred embodiment of FIG. 1.

FIG. 2 is a section view taken looking down along the joining plane of the sub-assemblies 22 of FIG. 1. Thus, is seen the upper edge of rectangular side frame 23 with flange 27 and an end view of flange 29 and the vertical "C" section 38 formed by outer face flange 24 and return flange 28. Side panel 34 and bottom 30 are also shown in their assembled relationship with rectangular side frame 23. The viewing plane cuts through reinforcing member 40, which is seen to fit closely within the internal dimension of "C" section 38, engaging the both side frames 23 so as to stiffen the length of cabinet side structure 26. It is also seen that the coped end of flange 27 allows reinforcing member 40 to be continuous through the jointed assembly, while holding it in position, against "C" section 38.

Figure 3:
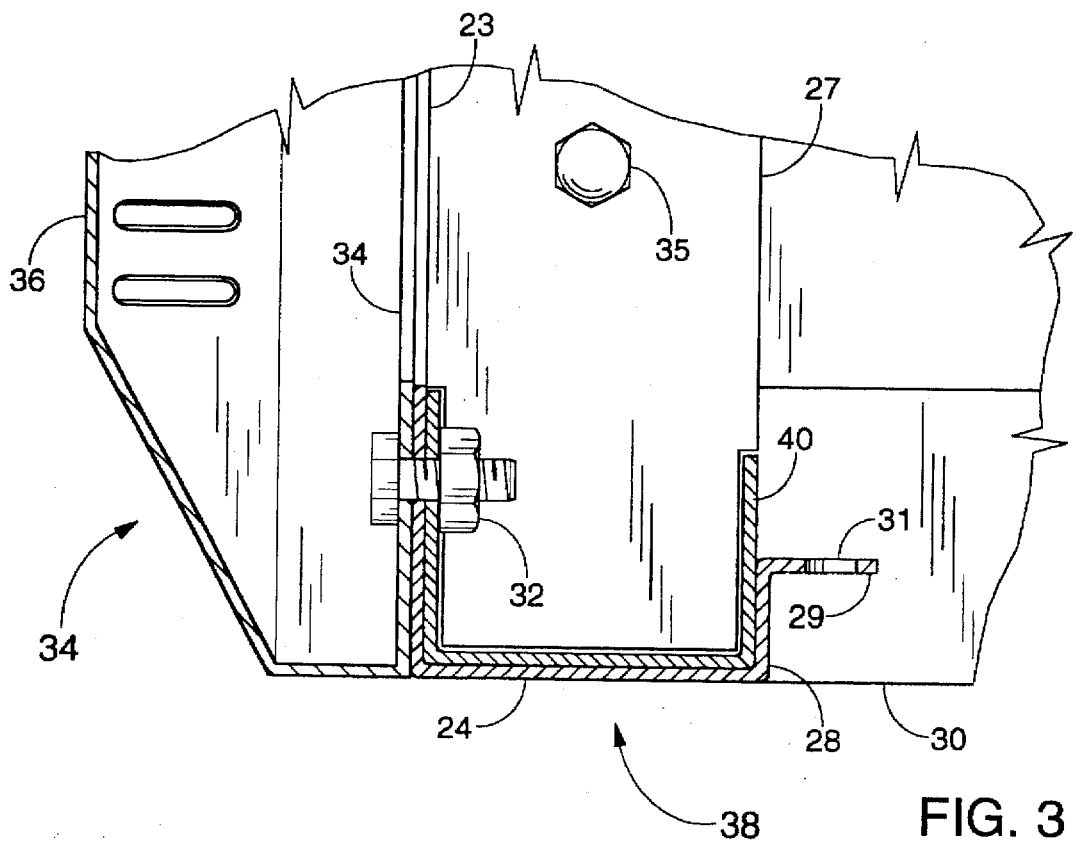
FIG. 3 shows a second section view of the same corner of the preferred embodiment as shown in FIG. 2.

FIG. 3 is a section view taken looking down along a plane above the viewing plane of FIG. 2 so as to show assembly details typical of all joint connections in cabinet side structures 26. Thus, unlike FIG. 2, the viewing plane passes through a side panel 34, "C" section 38 and flange 29, at the level of the bolt and nut assembly 32. Bolt and nut assemblies 32 serve to attach reinforcing members 40 and side panels 34 to side frames 23. A hole of bolt pattern 31 and nut and bolt assembly, which attaches upper and lower frames 23 together are also shown while the remaining elements in FIG. 3 are as previously described in FIG. 2.

Figure 4:
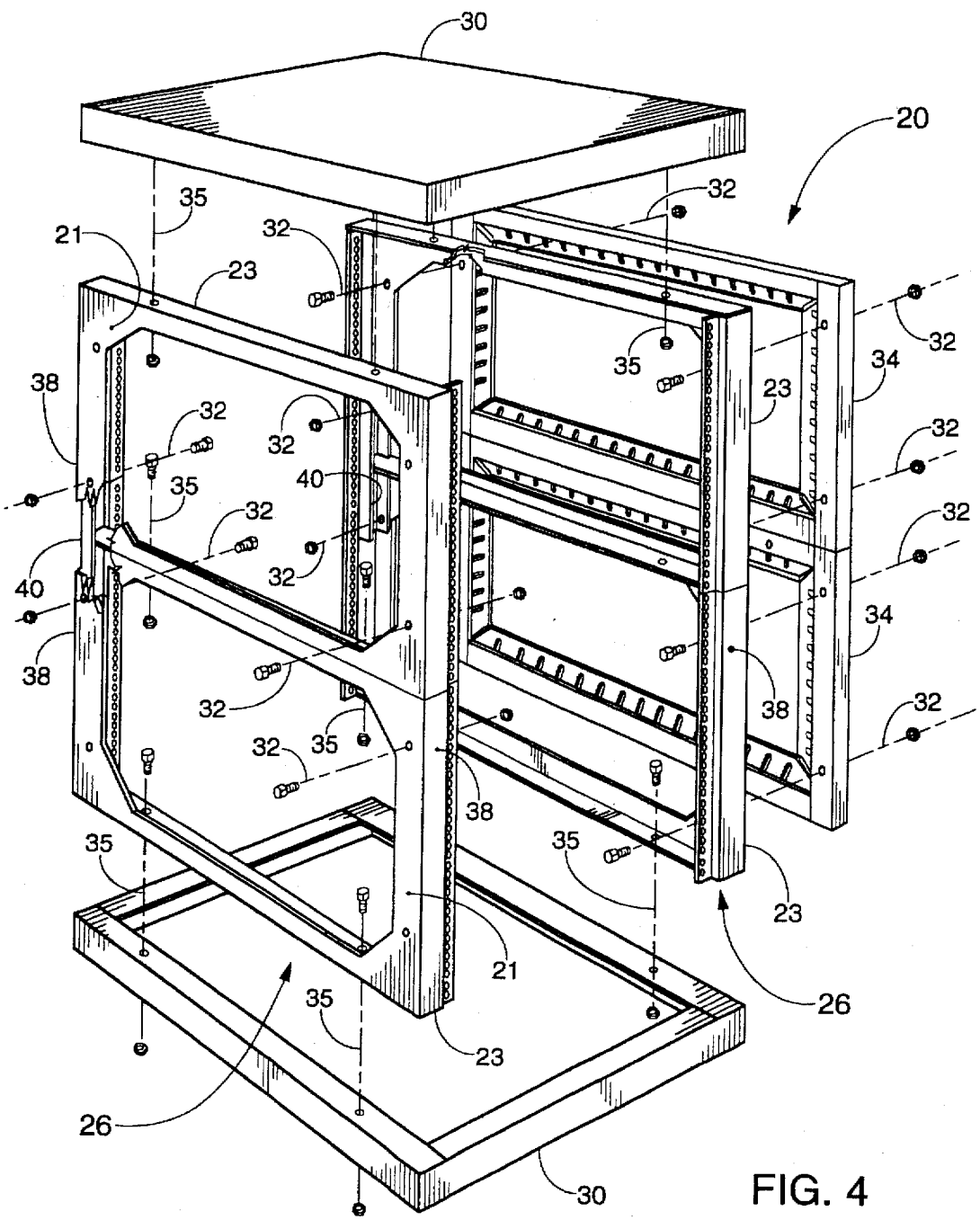
FIG. 4 shows an exploded view of the embodiment of FIG. 1.

FIG. 4 is an exploded view of cabinet 20 of FIG. 1, with side panels 34 deleted from the near side so as to more clearly show details of the present invention. Joining of the two rectangular side frames 23 to form cabinet side structure 26 and attachment of top and bottom panels 30 is shown to be accomplished by connecting bolt assemblies 35. Stiffening of cabinet side structure 26 is also shown to be provided by the overlapping engagement of reinforcing member 40 and "C" sections 38. Should it be desired to make an assembly of adjacent cabinets 20, it is evident that the omission of side panels 34 from both will allow bolt and nut assemblies 32 to also connect adjacent cabinet side structures 26 together face-to-face.

It is to be understood that the present invention is not limited to the embodiments disclosed but may also be expressed in other embodiments within the spirit of the invention, through rearrangement, modification or substitution of parts.

I claim:

1. A modular electronic equipment cabinet having an unobstructed interior comprising:

a plurality of modular side frames, each having a planar side bordered by two like longitudinal flanges perpendicular thereto and two like vertical member sections;

means for adjacently joining pairs of said side frames at said longitudinal flanges to provide a cabinet side structure wherein said vertical members are in alignment;

a reinforcing member fitting closely within said vertical members so as to extend into both adjoining side frames and reinforce the joint therebetween; and bottom and top members for assembly of said cabinet side structures as a standing unit.

2. A modular electronic equipment cabinet according to claim 1 and further comprising;

flanges extending from said vertical sections and perpendicular to said planar sides, said extending flanges including equipment mounting holes spaced along the length thereof; and said extending flanges and adjacent joining means being such that said flanges of adjacently joined side frames are in alignment.

3. A modular electronic equipment cabinet according to claim 1 wherein;

said side frames are made from flat sheet metal, both said longitudinal flanges and vertical members being formed by bending; and each said vertical member has a flange formed with a return flange so as to form a "C" section.

4. A modular electronic equipment cabinet according to claim 1 wherein said reinforcing member is a sheet metal member formed to fit within said vertical member.

5. A modular electronic equipment cabinet according to claim 1 and further comprising;

side panels attached to said planar sides; and ventilating means around the periphery of said side panels.

6. A modular electronic equipment cabinet according to claim 2 wherein said equipment mounting holes are spaced so as to provide a continuously repeating pattern along adjacently joined side frames.

7. A modular electronic equipment cabinet according to claim 3 wherein said reinforcing member is a sheet metal member formed to fit within said "C" section.

8. A modular electronic equipment cabinet according to claim 4 and further comprising;

side panels having ventilating means around the periphery thereof attached to said planar sides; and common means for attaching said reinforcing member to said vertical member and said side panels to said planar sides.

9. A method for reinforcing an assembly of stacked modules to produce an electronic equipment cabinet having an unobstructed interior comprising the steps of:

forming at least four modular side frame units, each bordered by two like longitudinal flanges and two like vertical sections;

providing a plurality of reinforcing members sized to fit closely within the like vertical sections;

inserting said reinforcing members so as to extend into vertical sections of a pair of modular frame units, aligning said vertical sections and reinforcing the joint therebetween;

joining pairs of modular frame units, so aligned, at the longitudinal flanges thereof; and connecting top and bottom panels across the respective unjoined longitudinal flanges of joined pairs of modular frame units to form a cabinet structure.

10. A method for reinforcing an assembly of stacked modules to produce an electronic equipment cabinet according to claim 9 and further comprising the step of forming the vertical sections as "C" sections.

* * * * *